US010892235B2

(12) United States Patent
Huang et al.

(10) Patent No.: US 10,892,235 B2
(45) Date of Patent: Jan. 12, 2021

(54) DIE SEAL RING AND MANUFACTURING METHOD THEREOF

(71) Applicant: United Microelectronics Corp., Hsinchu (TW)

(72) Inventors: Shih-Che Huang, Chiayi (TW); Shih-Hsien Chen, Kaohsiung (TW); Ching-Li Yang, Pingtung County (TW); Chih-Sheng Chang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 51 days.

(21) Appl. No.: 16/135,997

(22) Filed: Sep. 19, 2018

(65) Prior Publication Data
US 2020/0066657 A1    Feb. 27, 2020

(30) Foreign Application Priority Data
Aug. 23, 2018   (CN) .......................... 2018 1 0967619

(51) Int. Cl.
| | | |
|---|---|---|
| *H01L 21/764* | (2006.01) | |
| *H01L 21/768* | (2006.01) | |
| *H01L 23/58* | (2006.01) | |
| *H01L 23/10* | (2006.01) | |
| *H01L 23/522* | (2006.01) | |

(Continued)

(52) U.S. Cl.
CPC ........ *H01L 23/585* (2013.01); *H01L 21/4846* (2013.01); *H01L 21/7682* (2013.01); *H01L 23/10* (2013.01); *H01L 23/522* (2013.01); *H01L 23/562* (2013.01); *H01L 21/76807* (2013.01)

(58) Field of Classification Search
CPC ..... H01L 2221/1042; H01L 2221/1063; H01L 2221/1073; H01L 21/76807; H01L 21/76808; H01L 21/7681; H01L 21/76811; H01L 21/76813; H01L 21/7682; H01L 21/76831; H01L 21/76834; H01L 21/76837; H01L 21/76843; H01L 21/76844; H01L 23/10; H01L 23/522;
(Continued)

(56) References Cited

U.S. PATENT DOCUMENTS

| | | | |
|---|---|---|---|
| 6,492,247 B1 | 12/2002 | Guthrie et al. | |
| 6,900,539 B2 * | 5/2005 | Motoyama | ........ H01L 21/76843 257/751 |

(Continued)

*Primary Examiner* — Maliheh Malek
(74) *Attorney, Agent, or Firm* — J.C. Patents

(57) ABSTRACT

A die seal ring and a manufacturing method thereof are provided. The die seal ring includes a substrate, a dielectric layer, and conductive layers. The dielectric layer is disposed on the substrate. The conductive layers are stacked on the substrate and located in the dielectric layer. Each of the conductive layers includes a first conductive portion and a second conductive portion. The second conductive portion is disposed on the first conductive portion. A width of the first conductive portion is smaller than a width of the second conductive portion. A first air gap is disposed between a sidewall of the first conductive portion and the dielectric layer. A second air gap is disposed between a sidewall of the second conductive portion and the dielectric layer. The die seal ring and the manufacturing method thereof can effectively prevent cracks generated during the die sawing process from damaging the circuit structure.

9 Claims, 10 Drawing Sheets

(51) Int. Cl.
*H01L 21/48* (2006.01)
*H01L 23/00* (2006.01)

(58) Field of Classification Search
CPC .......... H01L 23/5222; H01L 23/53238; H01L 23/53295; H01L 23/562; H01L 23/585
See application file for complete search history.

(56) References Cited

U.S. PATENT DOCUMENTS

| | | | | |
|---|---|---|---|---|
| 6,952,052 B1* | 10/2005 | Marathe | ............ | H01L 21/76846 257/750 |
| 7,071,091 B2 | 7/2006 | Clarke et al. | | |
| 7,253,095 B2* | 8/2007 | Lur | ............ | H01L 21/7682 257/E21.581 |
| 7,285,474 B2* | 10/2007 | Anderson | ............ | H01L 21/76802 257/E21.579 |
| 7,382,038 B2* | 6/2008 | Wu | ............ | H01L 22/34 257/620 |
| 7,560,375 B2* | 7/2009 | Filippi | ............ | H01L 21/76807 438/619 |
| 7,994,046 B2* | 8/2011 | Jeng | ............ | H01L 21/76814 438/619 |
| 7,998,861 B2* | 8/2011 | Lee | ............ | H01L 21/76898 257/587 |
| 8,298,911 B2* | 10/2012 | Lee | ............ | H01L 21/7682 438/421 |
| 8,354,734 B2 | 1/2013 | Wang et al. | | |
| 9,425,127 B2* | 8/2016 | Yu | ............ | H01L 21/76898 |
| 9,443,956 B2* | 9/2016 | Yu | ............ | H01L 29/4991 |
| 9,455,178 B2* | 9/2016 | Kao | ............ | H01L 21/764 |
| 9,601,354 B2 | 3/2017 | Reber et al. | | |
| 9,608,065 B1* | 3/2017 | Bergendahl | ............ | H01L 27/0886 |
| 9,627,316 B1* | 4/2017 | Chang | ............ | H01L 23/53295 |
| 9,666,533 B1* | 5/2017 | Basker | ............ | H01L 21/76897 |
| 9,768,118 B1* | 9/2017 | Li | ............ | H01L 23/5283 |
| 9,812,359 B2* | 11/2017 | Chen | ............ | H01L 21/76898 |
| 9,853,025 B1* | 12/2017 | Yang | ............ | H01L 28/24 |
| 9,899,320 B2* | 2/2018 | Chang | ............ | H01L 29/0649 |
| 10,109,519 B2* | 10/2018 | Kao | ............ | H01L 21/7682 |
| 10,204,826 B1* | 2/2019 | Hsu | ............ | H01L 29/66795 |
| 10,276,498 B2* | 4/2019 | Yang | ............ | H01L 21/76807 |
| 10,366,993 B2* | 7/2019 | Chang | ............ | H01L 29/0649 |
| 10,388,567 B2* | 8/2019 | Chen | ............ | H01L 23/481 |
| 10,388,770 B1* | 8/2019 | Xie | ............ | H01L 29/785 |
| 10,395,988 B1* | 8/2019 | Cheng | ............ | H01L 29/66545 |
| 10,418,275 B1* | 9/2019 | Yang | ............ | H01L 21/764 |
| 10,522,642 B2* | 12/2019 | Lee | ............ | H01L 21/02068 |
| 10,535,603 B2* | 1/2020 | Chang | ............ | H01L 23/5226 |
| 10,573,724 B2* | 2/2020 | Cheng | ............ | H01L 29/4966 |
| 10,665,499 B2* | 5/2020 | Reshotko | ............ | H01L 23/5329 |
| 2005/0074961 A1* | 4/2005 | Beyer | ............ | H01L 21/764 438/619 |
| 2005/0230836 A1* | 10/2005 | Clarke | ............ | H01L 21/7682 257/760 |
| 2006/0030128 A1* | 2/2006 | Bu | ............ | H01L 21/76807 438/462 |
| 2006/0057835 A1* | 3/2006 | Anderson | ............ | H01L 23/53295 438/619 |
| 2006/0073695 A1* | 4/2006 | Filippi | ............ | H01L 21/76807 438/619 |
| 2006/0290002 A1* | 12/2006 | Arana | ............ | H01L 21/76898 257/774 |
| 2007/0102791 A1 | 5/2007 | Wu | | |
| 2007/0178713 A1 | 8/2007 | Jeng | | |
| 2008/0157269 A1* | 7/2008 | Wong | ............ | H01L 23/5252 257/529 |
| 2008/0182405 A1* | 7/2008 | Liu | ............ | H01L 21/76807 438/623 |
| 2009/0121313 A1 | 5/2009 | Hashimoto | | |
| 2009/0134517 A1* | 5/2009 | Usui | ............ | H01L 21/7682 257/751 |
| 2011/0021036 A1* | 1/2011 | Braecklmann | ............ | H01L 21/76829 438/763 |
| 2013/0147046 A1* | 6/2013 | Chang | ............ | H01L 21/764 257/751 |
| 2014/0299989 A1* | 10/2014 | Lim | ............ | H01L 23/48 257/751 |
| 2015/0228531 A1* | 8/2015 | Tagami | ............ | H01L 21/7682 257/773 |
| 2015/0243544 A1* | 8/2015 | Alptekin | ............ | H01L 21/7682 438/586 |
| 2016/0027726 A1* | 1/2016 | Zhu | ............ | H01L 23/5283 257/751 |
| 2016/0276260 A1* | 9/2016 | Liou | ............ | H01L 23/53295 |
| 2017/0194423 A1* | 7/2017 | Lin | ............ | H04N 5/2254 |
| 2018/0012791 A1* | 1/2018 | Sun | ............ | H01L 23/53295 |
| 2018/0069092 A1* | 3/2018 | Samavedan | ............ | H01L 29/785 |
| 2018/0151745 A1* | 5/2018 | Chang | ............ | H01L 21/82345 |
| 2018/0166319 A1* | 6/2018 | Park | ............ | H01L 29/6653 |
| 2018/0166383 A1* | 6/2018 | Cao | ............ | H01L 21/76837 |
| 2018/0204759 A1* | 7/2018 | Bruce | ............ | H01L 23/53238 |
| 2019/0067087 A1* | 2/2019 | Briggs | ............ | H01L 21/76811 |
| 2019/0096819 A1* | 3/2019 | Chen | ............ | H01L 21/7685 |
| 2019/0221475 A1* | 7/2019 | Hong | ............ | H01L 21/7682 |
| 2019/0296123 A1* | 9/2019 | Lee | ............ | H01L 21/02167 |
| 2019/0378909 A1* | 12/2019 | Cheng | ............ | H01L 29/4991 |
| 2020/0006652 A1* | 1/2020 | Cheng | ............ | H01L 45/14 |
| 2020/0020776 A1* | 1/2020 | Yang | ............ | H01L 21/76897 |
| 2020/0058544 A1* | 2/2020 | Chou | ............ | H01L 21/02063 |

* cited by examiner

DIE SEAL RING AND MANUFACTURING METHOD THEREOF

CROSS REFERENCE TO RELATED APPLICATION

This application claims the priority benefits of China application serial no. 201810967619.8, filed on Aug. 23, 2018. The entirety of the above-mentioned patent application is hereby incorporated by reference herein and made a part of specification.

BACKGROUND OF THE INVENTION

Field of the Invention

The invention relates to a semiconductor structure and a manufacturing method thereof, and particularly relates to a die seal ring and a manufacturing method thereof.

Description of Related Art

With the rapid development of technology, the integrated circuits (ICs) devices have been widely used in our daily lives. Generally speaking, the fabrication of ICs can be roughly classified into three main stages: the fabrication of silicon wafers, the fabrication of ICs, and the IC packaging. For the IC packaging, the very first step is performing the die saw process.

However, when performing the die saw process along the scribe line region, excessive stress induced during the die saw process will cause cracks in the die. When the crack continues to extend toward the inner part of the die, the crack will pass through the die seal ring and damage to the circuit structure.

SUMMARY OF THE INVENTION

The invention provides a die seal ring and a manufacturing method thereof, which can effectively prevent the crack generated during the die saw process from damaging the circuit structure.

The invention provides a die seal ring, which includes a substrate, a dielectric layer, and conductive layers. The dielectric layer is disposed on the substrate. The conductive layers are stacked on the substrate and located in the dielectric layer. Each of the conductive layers includes a first conductive portion and a second conductive portion. The second conductive portion is disposed on the first conductive portion. A width of the first conductive portion is smaller than a width of the second conductive portion. A first air gap is disposed between a sidewall of the first conductive portion and the dielectric layer. A second air gap is disposed between a sidewall of the second conductive portion and the dielectric layer.

According to an embodiment of the invention, in the die seal ring, the first air gap and the second air gap may be not connected to each other.

According to an embodiment of the invention, in the die seal ring, the dielectric layer may be a multilayer structure.

According to an embodiment of the invention, in the die seal ring, a material of the dielectric layer is, for example, a low dielectric constant (low-k) material, silicon oxide, silicon nitride, or a combination thereof.

According to an embodiment of the invention, in the die seal ring, the low-k material is, for example, fluorosilicate glass (FSG), Black Diamond (registered trademark of Applied Materials), or methyl silsesquioxane (MSQ).

According to an embodiment of the invention, in the die seal ring, the first conductive portion and the second conductive portion in each of the conductive layers may be integrally formed.

According to an embodiment of the invention, the die seal ring may further include a strengthening layer. The strengthening layer is disposed between the first air gap and the first conductive portion and between the second air gap and the second conductive portion.

According to an embodiment of the invention, the die seal ring may further include a strengthening layer. The strengthening layer is disposed between the first air gap and the dielectric layer and between the second air gap and the dielectric layer.

According to an embodiment of the invention, the die seal ring may further include a first strengthening layer and a second strengthening. The first strengthening layer is disposed between the first air gap and the dielectric layer and between the second air gap and the dielectric layer. The second strengthening layer disposed between the first air gap and the first conductive portion and between the second air gap and the second conductive portion.

According to an embodiment of the invention, in the die seal ring, a material of the first strengthening layer and the second strengthening layer is, for example, aluminum nitride (AlN), titanium nitride (TiN), or tantalum nitride (TaN).

The invention provides a method of manufacturing a die seal ring, which includes the following steps. A dielectric layer is formed on a substrate. Conductive layers stacked on the substrate are formed in the dielectric layer. Each of the conductive layers includes a first conductive portion and a second conductive portion. The second conductive portion is disposed on the first conductive portion. A width of the first conductive portion is smaller than a width of the second conductive portion. A first air gap is formed between a sidewall of the first conductive portion and the dielectric layer. A second air gap is formed between a sidewall of the second conductive portion and the dielectric layer.

According to an embodiment of the invention, in the method of manufacturing the die seal ring, the first air gap and the second air gap may be not connected to each other.

According to an embodiment of the invention, in the method of manufacturing the die seal ring, a method of forming the first conductive portion and the second conductive portion of each of the conductive layers may be a dual damascene method.

According to an embodiment of the invention, in the method of manufacturing the die seal ring, a method of forming the first air gap and the second air gap may include the following steps. A first thermal degradable polymer (TDP) sacrificial layer is formed between the sidewall of the first conductive portion and the dielectric layer. A second TDP sacrificial layer is formed between the sidewall of the second conductive portion and the dielectric layer. A thermal process is performed to remove the first TDP sacrificial layer and the second TDP sacrificial layer.

According to an embodiment of the invention, in the method of manufacturing the die seal ring, a method of foiling the first air gap and the second air gap may include the following steps. A dual damascene opening is formed in the dielectric layer. The dual damascene opening includes a lower opening and an upper opening connected with each other. A TDP layer is conformally formed on a surface of the dual damascene opening. An etch-back process is performed on the TDP layer to form a first TDP sacrificial layer on a sidewall of the lower opening and form a second TDP sacrificial layer on a sidewall of the upper opening. The conductive layer is formed in the dual damascene opening. A thermal process is performed to remove the first TDP sacrificial layer and the second TDP sacrificial layer.

According to an embodiment of the invention, the method of manufacturing the die seal ring may further include forming a cap layer formed on the conductive layer. The thermal process may be performed after the cap layer is formed.

According to an embodiment of the invention, the method of manufacturing the die seal ring may further include forming a cap layer formed on the conductive layer. The thermal process may be performed before the cap layer is formed.

According to an embodiment of the invention, the method of manufacturing the die seal ring may further include forming a strengthening layer between the first air gap and the first conductive portion and between the second air gap and the second conductive portion.

According to an embodiment of the invention, the method of manufacturing the die seal ring may further include forming a strengthening layer between the first air gap and the dielectric layer and between the second air gap and the dielectric layer.

According to an embodiment of the invention, the method of manufacturing the die seal ring may further include the following steps. A first strengthening layer is formed between the first air gap and the dielectric layer and between the second air gap and the dielectric layer. A second strengthening layer is formed between the first air gap and the first conductive portion and between the second air gap and the second conductive portion.

Based on the above, in the die seal ring and the manufacturing method thereof according to the present invention, the first air gap is located between the sidewall of the first conductive portion and the dielectric layer, and the second air gap is located between the sidewall of the second conductive portion and the dielectric layer. Therefore, the extension path of the crack generated during the die saw process can be blocked by the first air gap and the second air gap to prevent the crack from extending into the circuit region, thereby preventing the crack from damaging the circuit structure.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1G are cross-sectional views illustrating a manufacturing process of a die seal ring according to an embodiment of the invention. FIG. 2 is a cross-sectional view illustrating a semiconductor structure according to an embodiment of the invention.

Figure 1A:
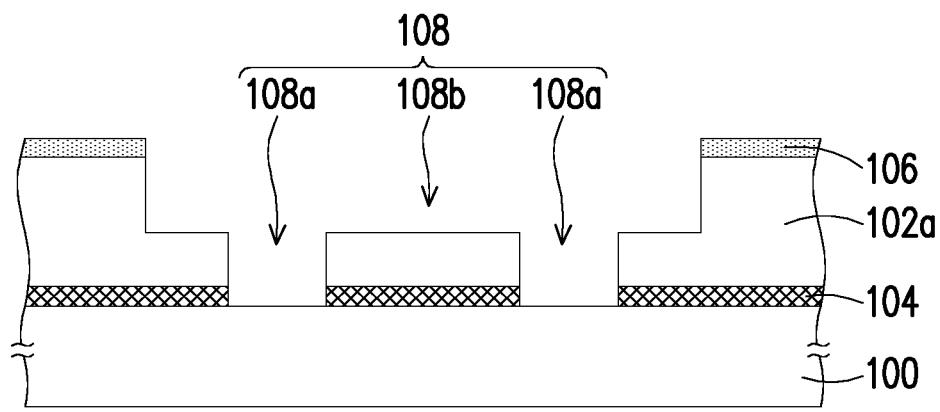
FIG. 1A to FIG. 1G are cross-sectional views illustrating a manufacturing process of a die seal ring according to an embodiment of the invention.
Figure 2:
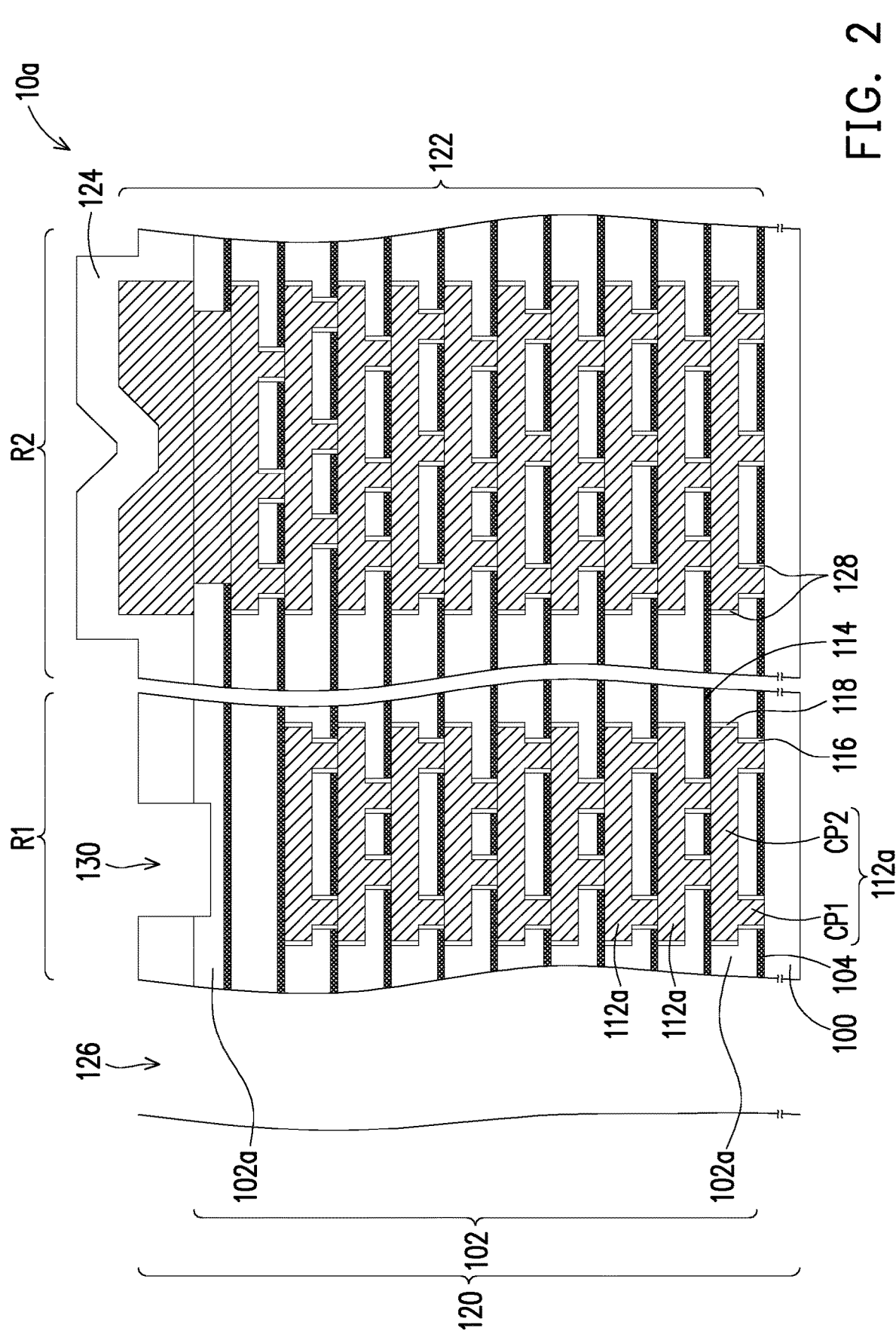
FIG. 2 is a cross-sectional view illustrating a semiconductor structure according to an embodiment of the invention.

Referring to FIG. 1A, a dielectric layer 102a is formed on a substrate 100. In an embodiment, the substrate 100 may include a semiconductor substrate (e.g., silicon substrate) and may further include a semiconductor device and an interconnect structure formed on the semiconductor substrate in the front end of line (FEOL). In FIG. 1A, the substrate 100 is depicted as a single-layer structure to simplify the description.

The dielectric layer 102a may be a single-layer structure or a multilayer structure. The material of the dielectric layer 102a is, for example, a low-k material, silicon oxide, silicon nitride, or a combination thereof. The low-k material is, for example, fluorosilicate glass (FSG), Black Diamond (registered trademark of Applied Materials), or methyl silsesquioxane (MSQ). The method of forming the dielectric layer 102a is, for example, a chemical vapor deposition method or a spin coating method.

Moreover, a cap layer 104 can be formed between the substrate 100 and the dielectric layer 102a. The material of the cap layer 104 is, for example, silicon carbonitride (SiCN). The method of forming the cap layer 104 is, for example, a chemical vapor deposition method.

A hard mask layer 106 may be formed on the dielectric layer 102a. The material of the hard mask layer 106 is, for example, silicon oxynitride (SiON). The method of forming the hard mask layer 106 is, for example, a chemical vapor deposition method.

A dual damascene opening 108 is formed in the dielectric layer 102a. The dual damascene opening 108 includes a lower opening 108a and an upper opening 108b connected with each other. In the present embodiment, the number of lower openings 108a is exemplified by two, but the invention is not limited thereto. As long as the number of lower openings 108a is one or more, it falls within the scope covered by the invention. The method of forming the dual damascene opening 108 is, for example, patterning the dielectric layer 102a by performing a lithography process and an etch process. In addition, during the formation of the dual damascene opening 108, a portion of the cap layer 104 may be removed to expose the substrate 100. Therefore, it is advantageous to electrically connect the conductive layer 112a (FIG. 1E) subsequently formed in the dual damascene opening 108 with the conductive layer (not shown) in the substrate 100.

Figure 1B:
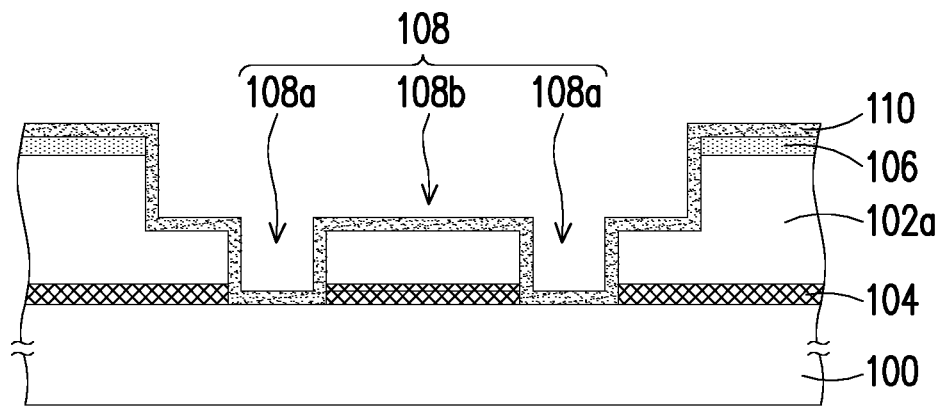

Referring to FIG. 1B, a TDP layer 110 is conformally formed on the surface of the dual damascene opening 108. The material of the TDP layer 110 is, for example, polymethylmethacrylate (PMMA) or polyoxymethylene (POM). The method of forming the TDP layer 110 is, for example, a chemical vapor deposition method.

Figure 1C:
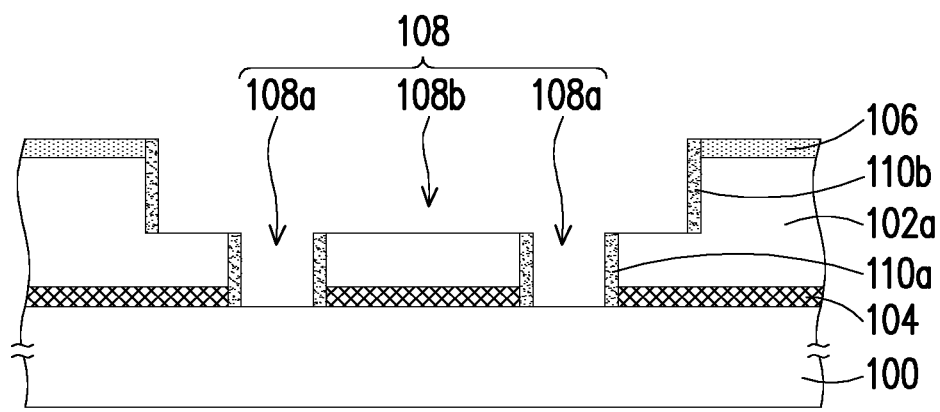

Referring to FIG. 1C, an etch-back process is performed on the TDP layer 110 to form a TDP sacrificial layer 110a on the sidewall of the lower opening 108a and form a TDP sacrificial layer 110b on the sidewall of the upper opening 108b.

Figure 1D:
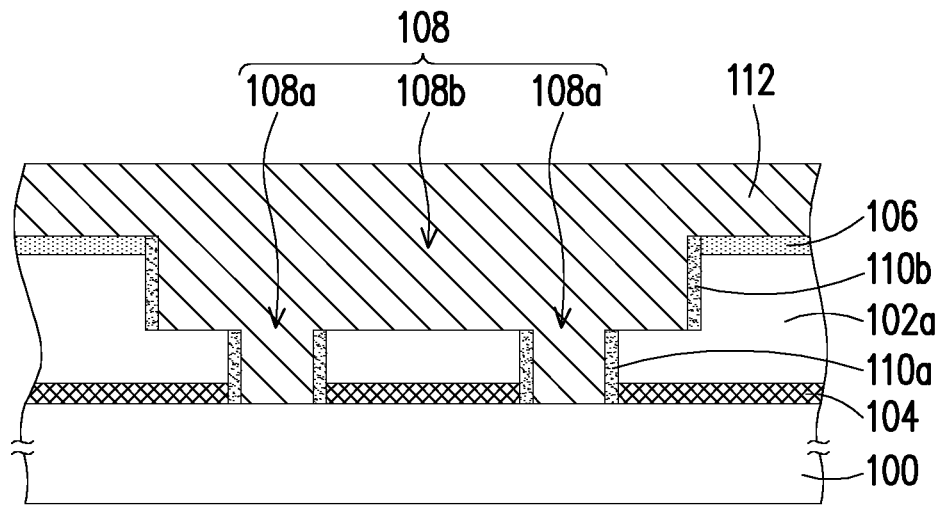

Referring to FIG. 1D, a conductive material layer 112 filling up the dual damascene opening 108 is formed. The material of the conductive material layer 112 is, for example, a metal material, such as copper. The method of forming the conductive material layer 112 is, for example, an electroplating method.

Figure 1E:
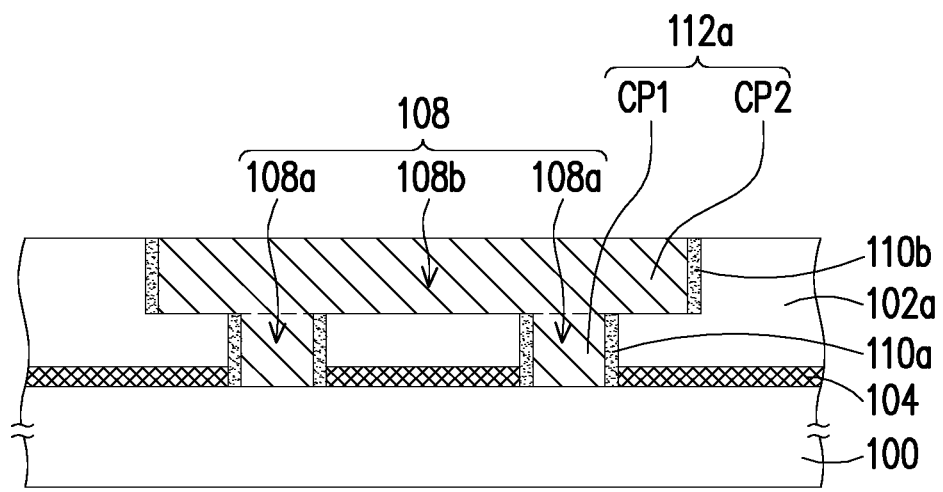

Referring to FIG. 1E, the conductive material layer 112 outside the dual damascene opening 108 is removed to form a conductive layer 112a in the dual damascene opening 108. The conductive layer 112a includes a conductive portion CP1 and a conductive portion CP2. The conductive portion CP2 is disposed on the conductive portion CP1. The width of the conductive portion CP1 is smaller than the width of the conductive portion CP2. The conductive portion CP1 may be a via, and the conductive portion CP2 may be a conductive line. In the present embodiment, the number of the conductive portions CP1 is exemplified by two, but the invention is not limited thereto. As long as the number of the conductive portions CP1 is one or more, it falls within the scope covered by the invention. The method of removing the conductive material layer 112 outside the dual damascene opening 108 is, for example, a chemical mechanical polishing (CMP) method. Based on the above, the method of forming the conductive portion CP1 and the conductive portion CP2 may be a dual damascene method, and the conductive portion CP1 and the conductive portion CP2 in the conductive layer 112a may be integrally formed, but the invention is not limited thereto. In addition, in the step of removing the conductive material layer 112 outside the dual damascene opening 108, the hard mask layer 106 may be removed at the same time, but the invention is not limited thereto. In another embodiment, the hard mask layer 106 may be separately removed.

Figure 1F:
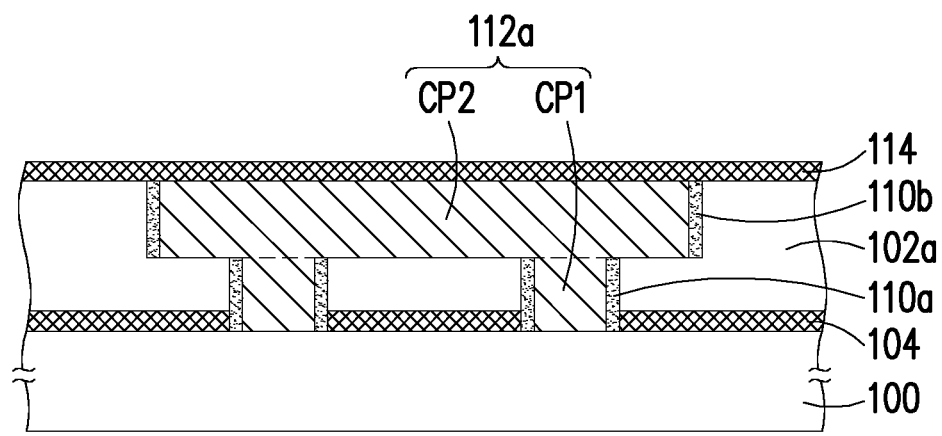

Referring to FIG. 1F, a cap layer 114 may be formed on the conductive layer 112a. The material of the cap layer 114 is, for example, silicon carbonitride (SiCN). The method of forming the cap layer 114 is, for example, a chemical vapor deposition method.

Figure 1G:
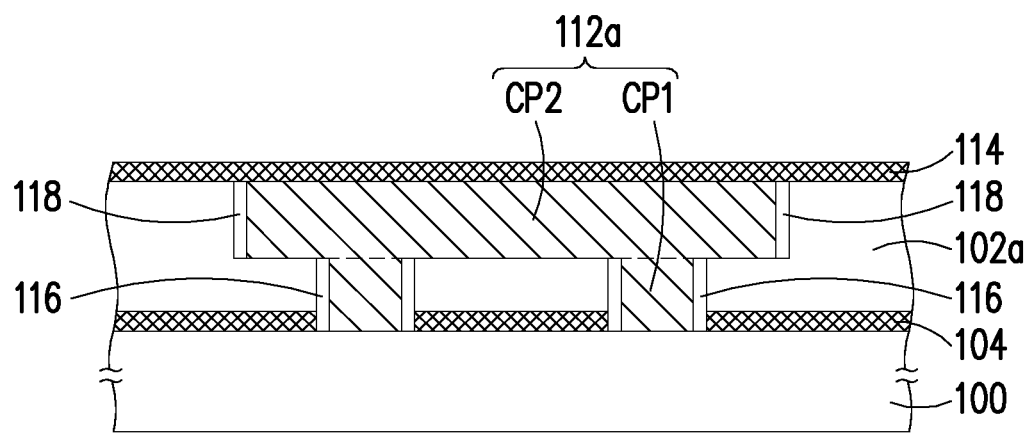

Referring to FIG. 1G, a thermal process is performed to remove the TDP sacrificial layer 110a and the TDP sacrificial layer 110b, so that an air gap 116 is formed between the sidewall of the conductive portion CP1 and the dielectric layer 102a, and an air gap 118 is formed between the sidewall of the conductive portion CP2 and the dielectric layer 102a. The air gap 116 and the air gap 118 can block the extension path of the crack generated during the die saw process to prevent the crack from damaging the circuit structure. The air gap 116 and the air gap 118 may be not connected to each other.

In the present embodiment, the thermal process is performed after the cap layer 114 is formed. In other words, the cap layer 114 is formed first, and then the air gap 116 and the air gap 118 are formed, but the invention is not limited thereto. In another embodiment, the thermal process may be performed before the cap layer 114 is formed. In other words, the air gap 116 and the air gap 118 may be formed first, and then the cap layer 114 is formed.

Based on the above, in an embodiment, the method of forming the air gap 116 and the air gap 118 may include the following steps. A TDP sacrificial layer 110a is formed between the sidewall of the conductive portion CP1 and the dielectric layer 102a. A TDP sacrificial layer 110b is formed between the sidewall of the conductive portion CP2 and the dielectric layer 102a. A thermal process is performed to remove the TDP sacrificial layer 110a and the TDP sacrificial layer 110b.

Referring to FIG. 2, the steps of FIG. 1A through FIG. 1G may be repeated, so that a dielectric layer 102 is formed on the substrate 100, and the conductive layers 112a stacked on the substrate 100 are formed in the dielectric layer 102. The dielectric layer 102 may be a multilayer structure. For example, in the present embodiment, the dielectric layer 102 may include the dielectric layers 102a.

By the above method, a die seal ring 120 in a semiconductor structure 10a may be formed in a die seal ring region R1. Hereinafter, the semiconductor structure 10a and the die seal ring 120 of the above embodiment are described with reference to FIG. 2.

The semiconductor structure 10a may include a die seal ring 120. The die seal ring 120 includes a substrate 100, a dielectric layer 102, and conductive layers 112a. The die seal ring 120 may further include at least one of a cap layer 104 and cap layers 114. The dielectric layer 102 is disposed on the substrate 100. The conductive layers 112a are stacked on the substrate 100 and located in the dielectric layer 102. Each of the conductive layers 112a includes a conductive portion CP1 and a conductive portion CP2. The conductive portion CP2 is disposed on the conductive portion CP1. The width of the conductive portion CP1 is smaller than the width of the conductive portion CP2. An air gap 116 is disposed between the sidewall of the conductive portion CP1 and the dielectric layer 102a. An air gap 118 is disposed between the sidewall of the conductive portion CP2 and the dielectric layer 102a. The air gap 116 and the air gap 118 may be not connected to each other. The cap layer 104 is disposed between the substrate 100 and the dielectric layer 102. The cap layer 114 is disposed between the upper and lower adjacent two dielectric layers 102a. In the upper and lower adjacent two conductive layers 112a, the conductive portion CP1 of the upper conductive layer 112a passes through the cap layer 114 and is electrically connected to the lower conductive layer 112a. In addition, the material, the arrangement, the forming method, the effect, and the like of each component in the die seal ring 120 have been described in detail in the above embodiments and are not repeated herein.

Furthermore, the semiconductor structure 10a may further include at least one of an interconnect structure 122, a protection layer 124, and a scribe line 126. The interconnect structure 122 is located in a circuit region R2. The circuit region R2 is, for example, an active circuit region. The interconnect structure 122 may be an interconnect structure of the back end of line (BEOL). A portion of the interconnect structure 122 and the die seal ring 120 may be simultaneously formed by the same process, and thus air gaps 128 may be formed between the sidewalls of a portion of the interconnect structure 122 and the dielectric layer 102. Moreover, the air gap 128 in the circuit region R2 helps to reduce the resistance-capacitance delay (RC Delay). The protection layer 124 covers the interconnect structure 122, and the protection layer 124 located in the die seal ring region R1 may have an opening 130. The opening 130 may block the extension path of the crack generated during the die saw process to prevent the crack from damaging the circuit structure. The scribe line 126 is located at the side of the die seal ring 120 away from the interconnect structure 122.

Based on the above, in the die seal ring 120 and the manufacturing method thereof, the air gap 116 is located between the sidewall of the conductive portion CP1 and the dielectric layer 102a, and the air gap 118 is between the sidewall of the conductive portion CP2 and the dielectric layer 102a. Therefore, the extension path of the crack generated during the die saw process can be blocked by the air gap 116 and the air gap 118 to prevent the crack from extending into the circuit region R2, thereby preventing the crack from damaging the circuit structure.

Figure 3A:
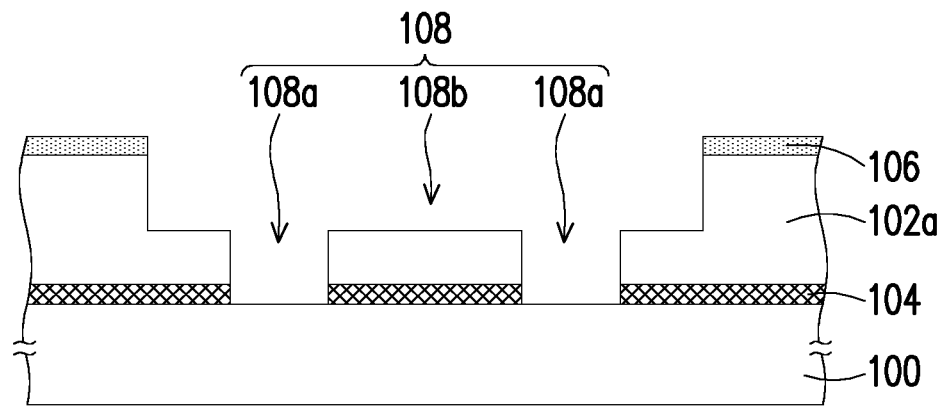
FIG. 3A to FIG. 3G are cross-sectional views illustrating a manufacturing process of a die seal ring according to another embodiment of the invention.
Figure 3B:
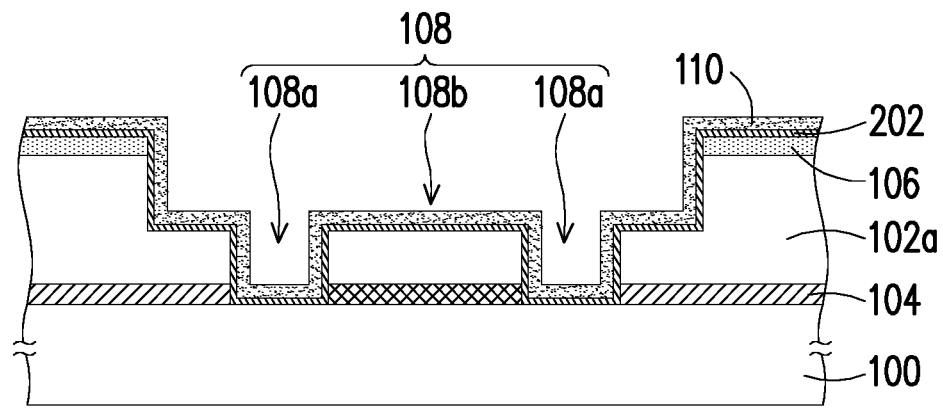
Figure 3C:
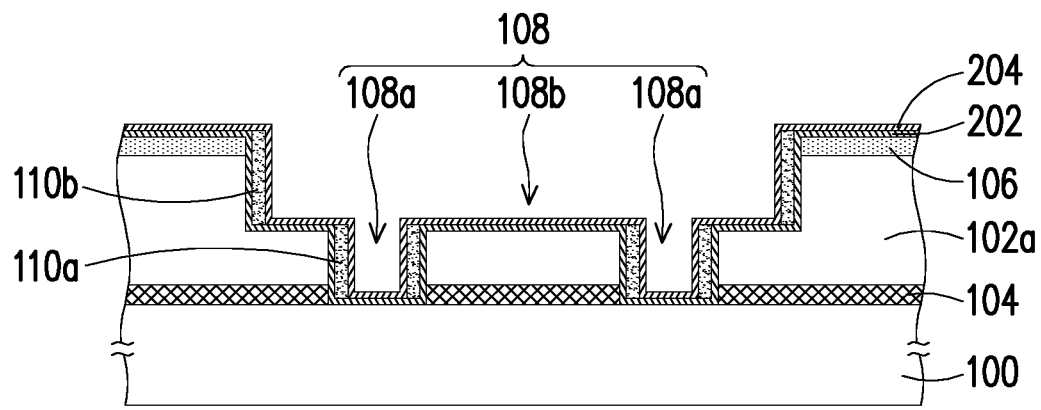
Figure 3D:
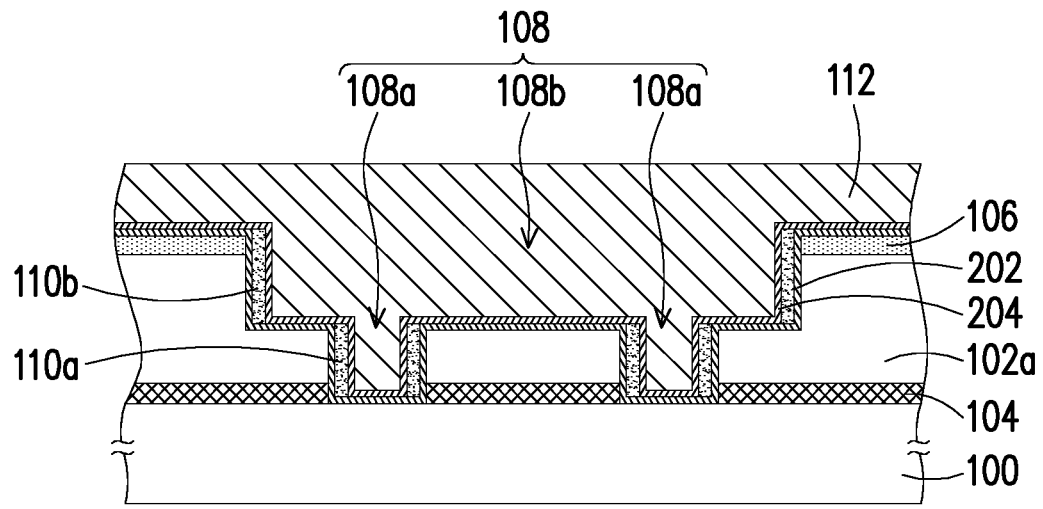
Figure 3E:
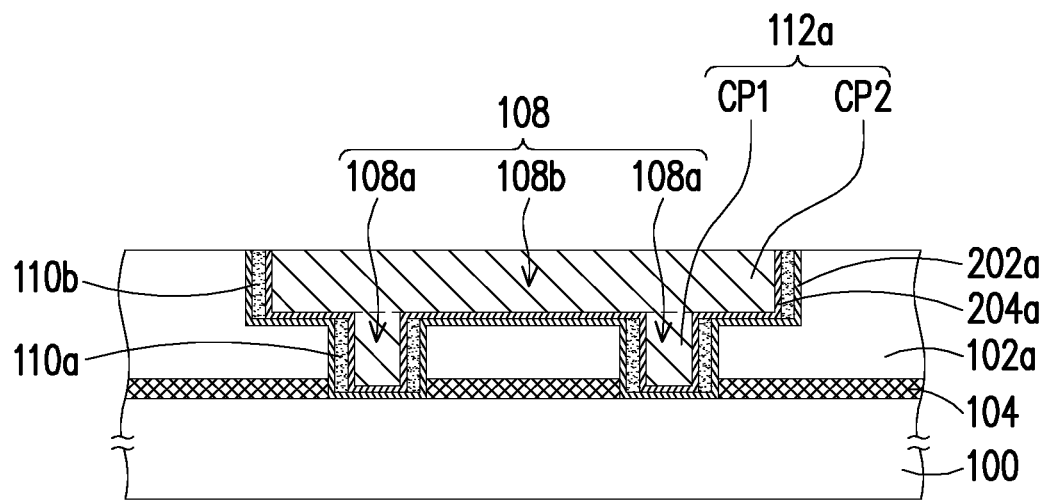
Figure 3F:
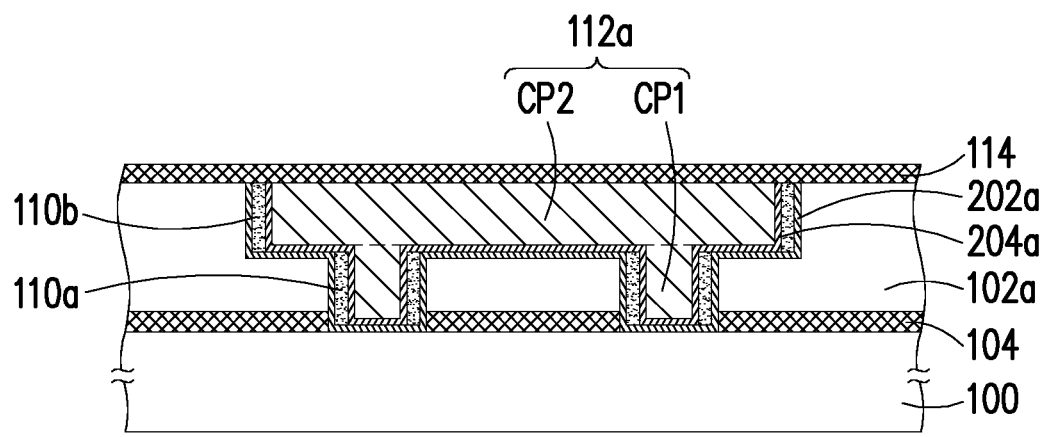
Figure 3G:
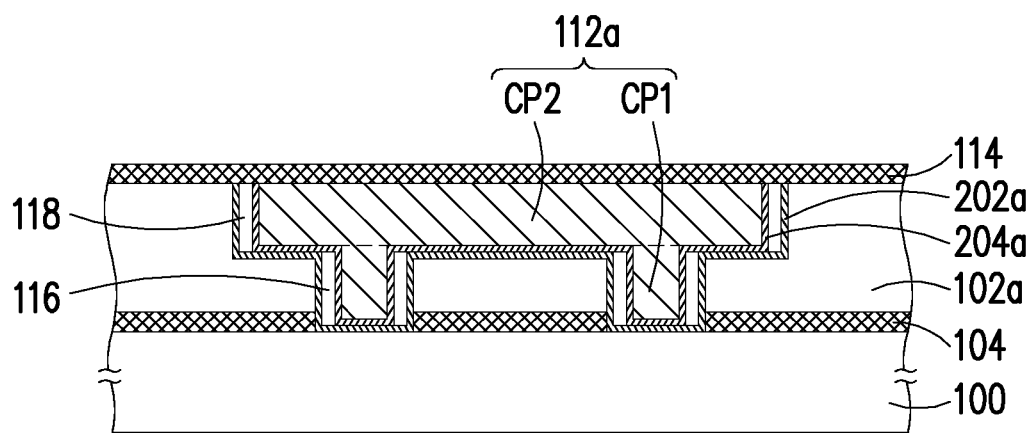
Figure 4:
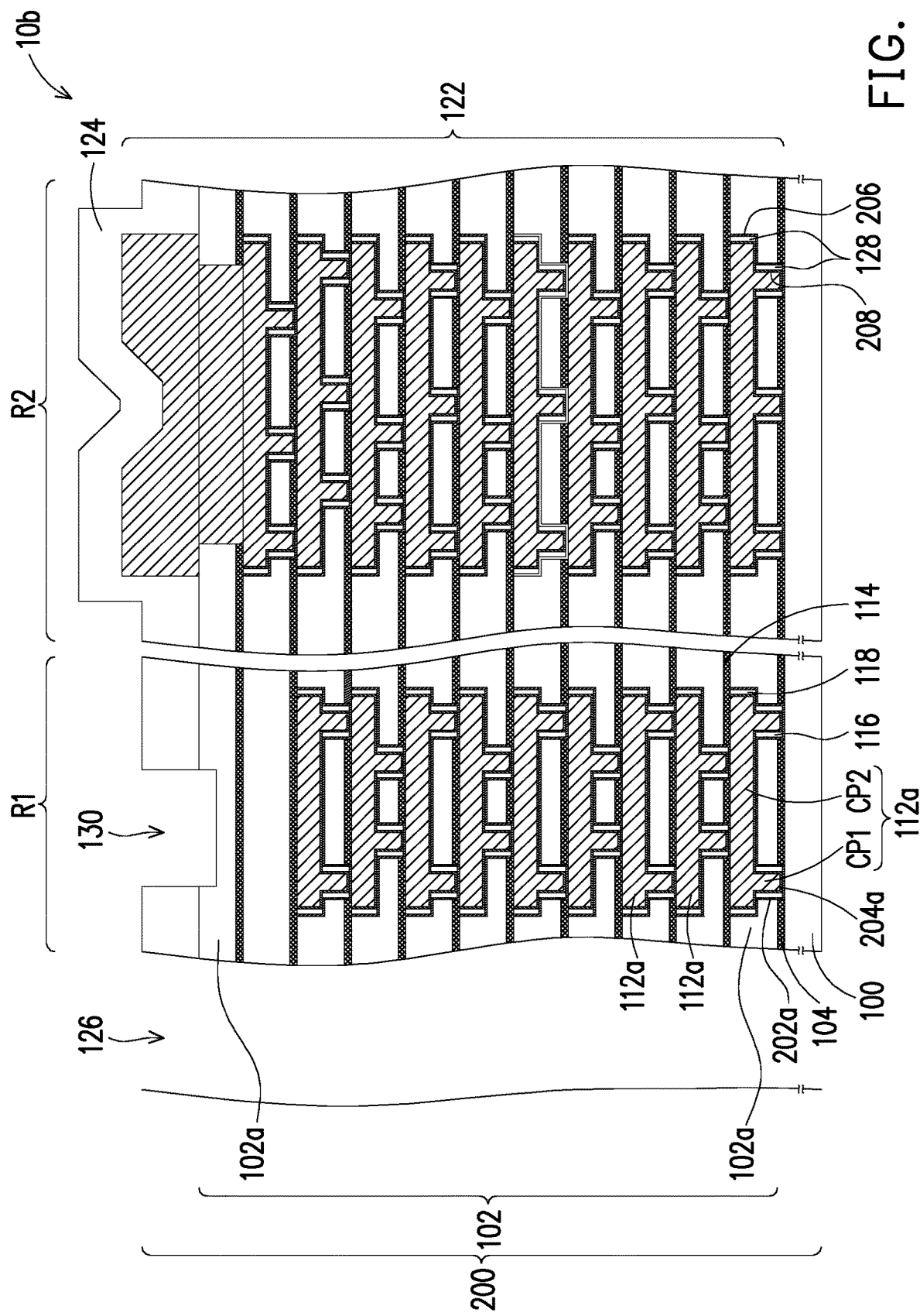
FIG. 4 is a cross-sectional view illustrating a semiconductor structure according to another embodiment of the invention.

FIG. 3A to FIG. 3G are cross-sectional views illustrating a manufacturing process of a die seal ring according to another embodiment of the invention. FIG. 4 is a cross-sectional view illustrating a semiconductor structure according to another embodiment of the invention.

Referring to FIG. 1A to FIG. 1G, FIG. 2, FIG. 3A to FIG. 3G and FIG. 4, the difference between the manufacturing method of die seal ring 200 of FIG. 4 and the manufacturing method of the die seal ring 120 of FIG. 2 is described as follows. In the manufacturing method of the die seal ring 200, a strengthening layer 202a is formed between the air gap 116 and the dielectric layer 102a and between the air gap 118 and the dielectric layer 102a, and a strengthening layer 204a is formed between the air gap 116 and the conductive portion CP1 and between the air gap 118 and the conductive portion CP2. The material of the strengthening layer 202a and the strengthening layer 204a is, for example, a conductive material, such as aluminum nitride (AlN), titanium nitride (TiN), or tantalum nitride (TaN).

For example, the method of forming the strengthening layer 202a and the strengthening layer 204a may include the following steps. Referring to FIG. 3B, a strengthening material layer 202 is conformally formed on the surface of the dual damascene opening 108. The method of forming the strengthening material layer 202 is, for example, a chemical vapor deposition method. Referring to FIG. 3C, after the TDP sacrificial layer 110a and the TDP sacrificial layer 110b are formed, a strengthening material layer 204 is conformally formed, and the strengthening material layer 204 covers the strengthening material layer 202, the TDP sacrificial layer 110a, and the TDP sacrificial layer 110b. The method of forming the strengthening material layer 204 is, for example, a chemical vapor deposition method. Referring to FIG. 3E, the strengthening material layer 204 and the strengthening material layer 202 outside the dual damascene opening 108 may be removed to form the strengthening layer 202a and the strengthening layer 204a. In an embodiment, in the step of removing the conductive material layer 112 outside the dual damascene opening 108, the strengthening material layer 204, the strengthening material layer 202, and the hard mask layer 106 outside the dual damascene opening 108 may be simultaneously removed, but the invention is not limited thereinto. In another embodiment, the strengthening material layer 204, the strengthening material layer 202, and the hard mask layer 106 outside the dual damascene opening 108 may be separately removed.

In addition, other steps in the manufacturing method of the die seal ring 200 may refer to the manufacturing method of the die seal ring 120, and the description thereof is not repeated herein.

Furthermore, a portion of the interconnect structure 122 and the die seal ring 200 may be simultaneously formed by the same process, and thus a strengthening layer 206 is formed between the air gap 128 and the dielectric layer 102a, and a strengthening layer 208 is formed between the air gap 128 and a portion of the interconnect structure 122.

On the other hand, in the semiconductor structure 10b of FIG. 4 and the semiconductor structure 10a of FIG. 2, the difference between the structure of the die seal ring 200 and the structure of the die seal ring 120 is described as follows. The die seal ring 200 further includes a strengthening layer 202a and a strengthening layer 204a. The strengthening layer 202a is disposed between the air gap 116 and the dielectric layer 102a and between the air gap 118 and the dielectric layer 102a. The strengthening layer 204a is disposed between the air gap 116 and the conductive portion CP1 and between the air gap 118 and the conductive portion CP2. Furthermore, the same components in the semiconductor structure 10b and the semiconductor structure 10a are denoted by the same reference numerals and the description thereof is omitted.

Based on the above embodiment, in the die seal ring 200 and the manufacturing method thereof, the structural strength of the die seal ring 200 can be increased by the strengthening layer 202a and the strengthening layer 204a, thereby improving the reliability of the semiconductor structure 10b.

Figure 5:
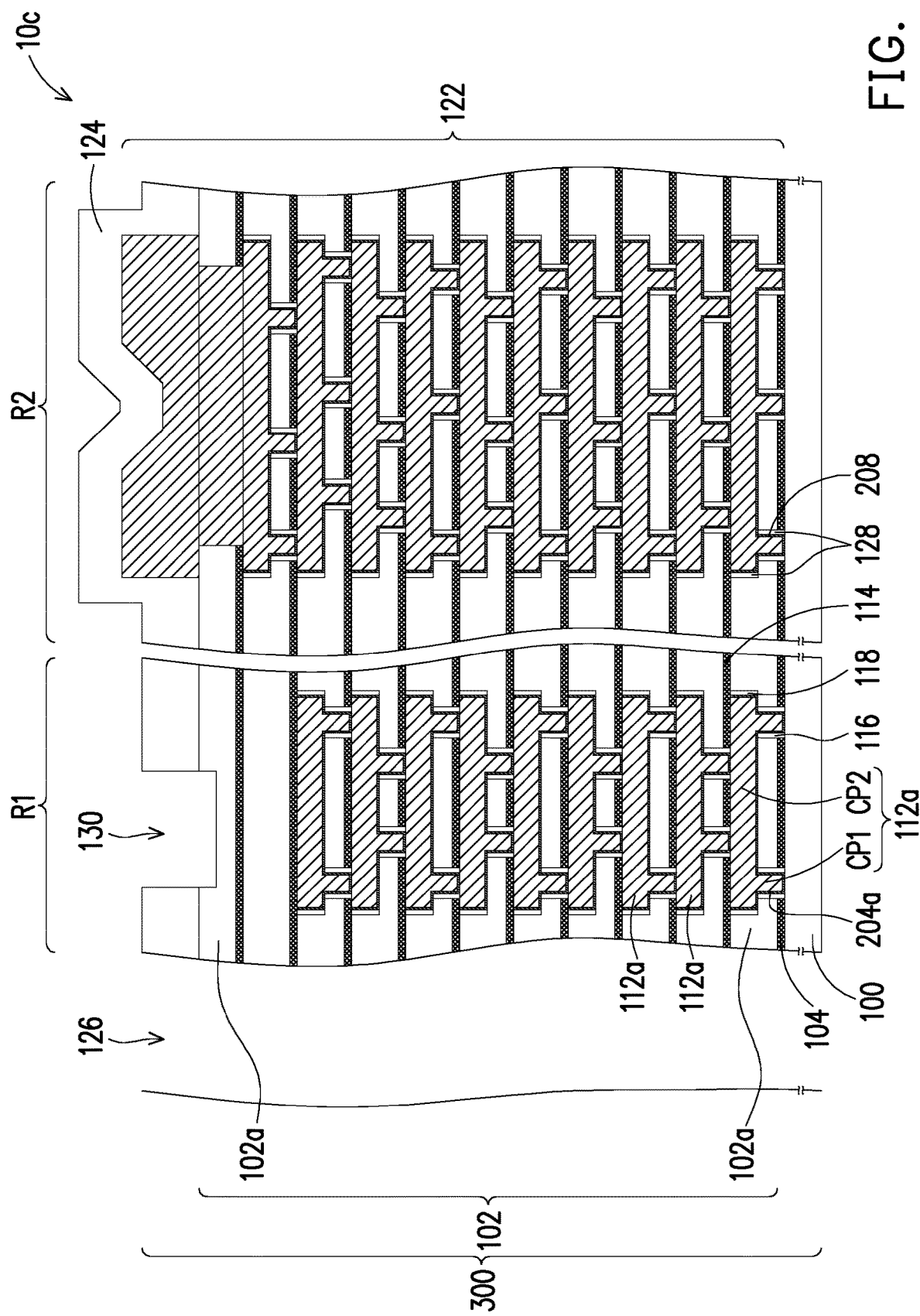
FIG. 5 is a cross-sectional view illustrating a semiconductor structure according to another embodiment of the invention.

FIG. 5 is a cross-sectional view illustrating a semiconductor structure according to another embodiment of the invention.

Referring to FIG. 5 and FIG. 4, the difference between the manufacturing method of the die seal ring 300 of FIG. 5 and the manufacturing method of the die seal ring 200 of FIG. 4 is described as follows. In the manufacturing method of the die seal ring 300, the strengthening layer 204a is formed between the air gap 116 and the conductive portion CP1 and between the air gap 118 and the conductive portion CP2, but the strengthening layer 202a is not formed between the air gap 116 and the dielectric layer 102a and between the air gap 118 and the dielectric layer 102a.

In addition, a portion of the interconnect structure 122 and the die seal ring 300 may be simultaneously formed by the same process, and thus the strengthening layer 208 is formed between the air gap 128 and a portion of the interconnect structure 122.

On the other hand, in the semiconductor structure 10c of FIG. 5 and the semiconductor structure 10b of FIG. 4, the difference between the structure of the die seal ring 300 and the structure of the die seal ring 200 is described as follows. The die seal ring 300 includes the strengthening layer 204a but does not include the strengthening layer 202a. Furthermore, the same components in the semiconductor structure 10c and the semiconductor structure 10b are denoted by the same reference numerals and the description thereof is omitted.

Based on the above embodiment, in the die seal ring 300 and the manufacturing method thereof, the structural strength of the die seal ring 300 can be increased by the strengthening layer 204a, thereby improving the reliability of the semiconductor structure 10c.

Figure 6:
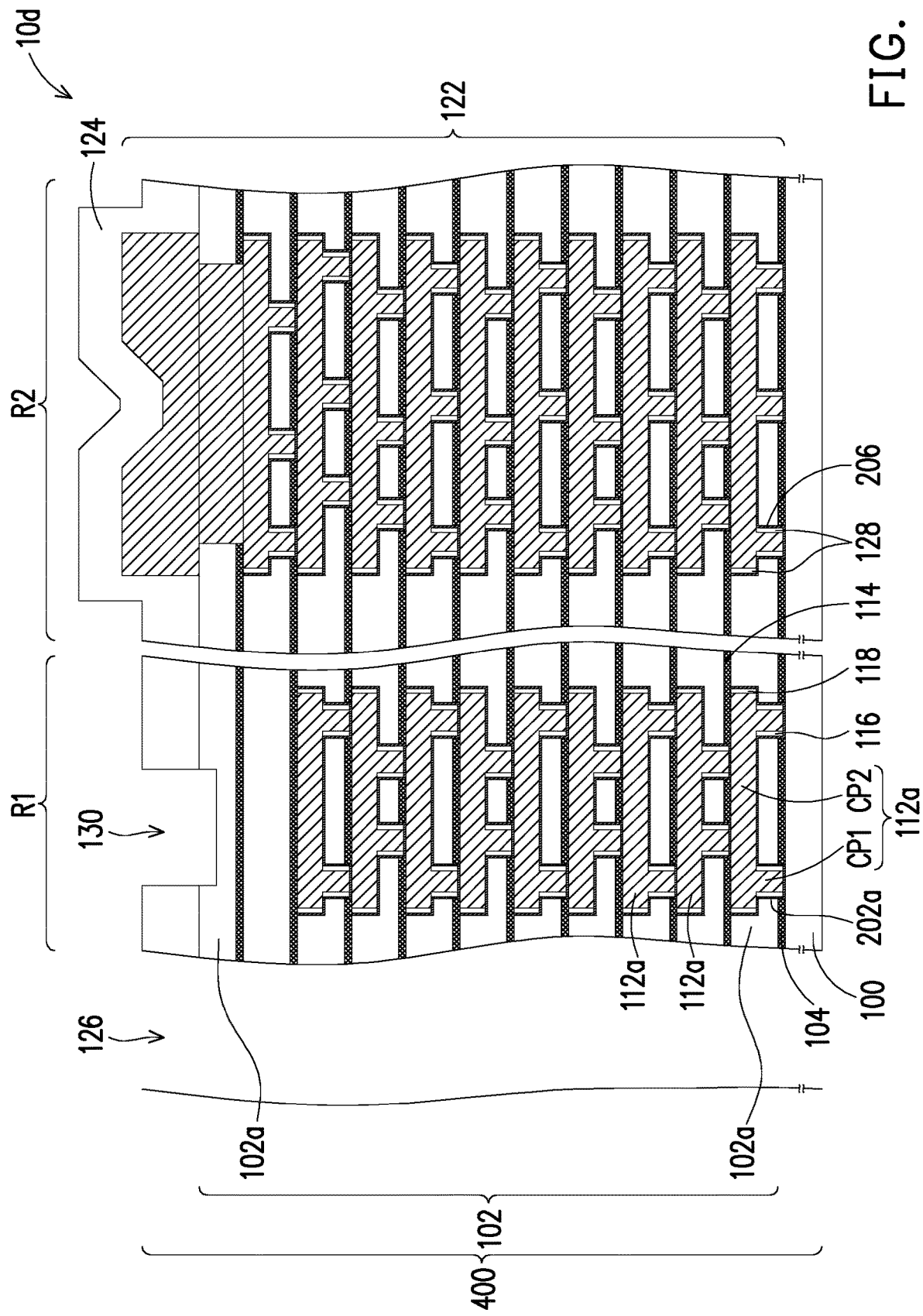
FIG. 6 is a cross-sectional view illustrating a semiconductor structure according to another embodiment of the invention.

FIG. 6 is a cross-sectional view illustrating a semiconductor structure according to another embodiment of the invention.

Referring to FIG. 6 and FIG. 4, the difference between the manufacturing method of the die seal ring 400 of FIG. 6 and the manufacturing method of the die seal ring 200 of FIG. 4 is described as follows. In the manufacturing method of the die seal ring 400, the strengthening layer 202a is formed between the air gap 116 and the dielectric layer 102a and between the air gap 118 and the dielectric layer 102a, but the strengthening layer 204a is not formed between the air gap 116 and the conductive portion CP1 and between the air gap 118 and the conductive portion CP2.

In addition, a portion of the interconnect structure 122 and the die seal ring 400 may be simultaneously formed by the same process, and thus the strengthening layer 206 is formed between the air gap 128 and the dielectric layer 102a.

On the other hand, in the semiconductor structure 10d of FIG. 6 and the semiconductor structure 10b of FIG. 4, the difference between the structure of the die seal ring 400 and the structure of the die seal ring 200 is described as follows. The die seal ring 400 includes a strengthening layer 202a but does not include a strengthening layer 204a. Furthermore, the same components in the semiconductor structure 10d and the semiconductor structure 10b are denoted by the same reference numerals and the description thereof is omitted.

Based on the above embodiment, in the die seal ring 400 and the manufacturing method thereof, the structural strength of the die seal ring 400 can be increased by the strengthening layer 202a, thereby improving the reliability of the semiconductor structure 10d.

In summary, in the die seal ring of the aforementioned embodiments and the manufacturing method thereof, the extension path of the crack generated during the die saw process can be blocked by the air gaps to prevent the crack from extending into the circuit region, thereby preventing the crack from damaging the circuit structure.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A die seal ring, comprising: a substrate; a dielectric layer disposed on the substrate; conductive layers stacked on the substrate and located in the dielectric layer, wherein each of the conductive layers comprises: a first conductive portion; and a second conductive portion disposed on the first conductive portion, wherein a width of the first conductive portion is smaller than a width of the second conductive portion, wherein a first air gap is disposed between a sidewall of the first conductive portion and the dielectric layer, and a second air gap is disposed between a sidewall of the second conductive portion and the dielectric layer; and a first strengthening layer disposed between the first air gap and the dielectric layer and between the second air gap and the dielectric layer, wherein the first air gap is located between the first strengthening layer and the first conductive portion, the second air gap is located between the first strengthening layer and the second conductive portion, and a portion of the first strengthening layer is directly below a bottom surface of the first conductive portion, wherein a material of the first strengthening layer comprises aluminum nitride, titanium nitride, or tantalum nitride.

2. The die seal ring according to claim 1, wherein the first air gap and the second air gap are not connected to each other.

3. The die seal ring according to claim 1, wherein the dielectric layer comprises a multilayer structure.

4. The die seal ring according to claim 1, wherein a material of the dielectric layer comprises a low dielectric constant (low-k) material, silicon oxide, silicon nitride, or a combination thereof.

5. The die seal ring according to claim 4, wherein the low-k material comprises fluorosilicate glass, Black Diamond, or methyl silsesquioxane.

6. The die seal ring according to claim 1, wherein the first conductive portion and the second conductive portion in each of the conductive layers are integrally formed.

7. The die seal ring according to claim 1, further comprising:
a second strengthening layer disposed between the first air gap and the first conductive portion and between the second air gap and the second conductive portion.

8. The die seal ring according to claim 7, wherein a material of the second strengthening layer comprises aluminum nitride, titanium nitride, or tantalum nitride.

9. A die seal ring, comprising: a substrate; a dielectric layer disposed on the substrate; conductive layers stacked on the substrate and located in the dielectric layer, wherein each of the conductive layers comprises: a first conductive portion; and a second conductive portion disposed on the first conductive portion, wherein a width of the first conductive portion is smaller than a width of the second conductive portion, wherein a first air gap is disposed between a sidewall of the first conductive portion and the dielectric layer, and a second air gap is disposed between a sidewall of the second conductive portion and the dielectric layer; and a first strengthening layer disposed between the first air gap and the dielectric layer and between the second air gap and the dielectric layer, wherein the first air gap is located between the first strengthening layer and the first conductive portion, the second air gap is located between the first strengthening layer and the second conductive portion, and the first strengthening layer is a continuous structure extending from one side of the first air gap to one side of the second air gap, wherein a material of the first strengthening layer comprises aluminum nitride, titanium nitride, or tantalum nitride.

* * * * *